United States Patent
Chen et al.

(10) Patent No.: US 11,777,454 B1
(45) Date of Patent: Oct. 3, 2023

(54) BIAS CIRCUIT FOR RADIO FREQUENCY POWER AMPLIFIER

(71) Applicant: Guangdong University of Technology, Guangzhou (CN)

(72) Inventors: Jianqiang Chen, Guangzhou (CN); Zhihao Zhang, Guangzhou (CN); Guohao Zhang, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/144,492

(22) Filed: May 8, 2023

(30) Foreign Application Priority Data

May 16, 2022 (CN) .......................... 202210530938.9

(51) Int. Cl.
  *H03F 1/32* (2006.01)
  *H03F 3/213* (2006.01)
(52) U.S. Cl.
  CPC ............ *H03F 1/3205* (2013.01); *H03F 3/213* (2013.01); *H03F 2200/21* (2013.01); *H03F 2200/451* (2013.01)
(58) Field of Classification Search
  CPC ........ H03F 1/223; H03F 1/0244; H03F 1/301; H03F 1/3205; H03F 3/211; H03F 3/45183; H03F 1/3282; H03F 1/025; H03F 1/0277; H03F 3/195; H03F 3/213; H03F 3/24; H03F 1/0227; H03F 1/56; H03F 3/45188; H03F 1/3247; H03F 2200/18; H03F 2200/408; H03F 2200/15; H03F 2200/387; H03F 2200/222; H03F 2201/3215; H03F 2200/78; H03F 2200/451; H03F 2200/534; H03F 2203/45731; H03F 2203/45638; H03F 2200/411; H03F 2201/3233;
  (Continued)

(56) References Cited

U.S. PATENT DOCUMENTS

2017/0133989 A1* 5/2017 Dykstra .................. H03F 1/223

FOREIGN PATENT DOCUMENTS

| CN | 102843107 A | 12/2012 |
| CN | 103457550 A | 12/2013 |

(Continued)

OTHER PUBLICATIONS

Jin et al., "Linearization of CMOS Cascode Power Amplifiers Through Adaptive Bias Control", IEEE Transactions On Microwave Theory and Techniques, vol. 61, No. 12, Dec. 2013 (Year: 2013).*

(Continued)

*Primary Examiner* — Hafizur Rahman

(57) ABSTRACT

Disclosed is a bias circuit for a radio frequency power amplifier, including a resistor voltage divider network, a power amplifier coupled with the resistor voltage divider network and a bias voltage adjusting loop coupled to the resistor voltage divider network and including one voltage divider resistor and one transistor pair; one terminal of the voltage divider resistor is connected with a reference voltage, and an other terminal is coupled with a gate of the first metal oxide semiconductor transistor; the transistor pair includes a first metal oxide semiconductor transistor and a second metal oxide semiconductor transistor, where a gate of the second metal oxide semiconductor transistor is coupled to the gate of the first metal oxide semiconductor transistor.

3 Claims, 5 Drawing Sheets

(58) Field of Classification Search
CPC .......... H03F 2200/61; H03F 2200/541; H03F 2200/336; H03F 2200/537; H03F 2203/45366; H03F 2200/468; H03F 2200/108; H03F 2200/129; H03F 2200/447; H03F 2203/21127; H03F 2203/45544; H03F 2200/102
USPC .......................................................... 330/296
See application file for complete search history.

(56) References Cited

FOREIGN PATENT DOCUMENTS

| CN | 203457108 U | | 2/2014 | |
| --- | --- | --- | --- | --- |
| CN | 103746665 A | * | 4/2014 | |
| CN | 104716905 A | | 6/2015 | |
| CN | 204442292 U | | 7/2015 | |
| CN | 106487344 A | * | 3/2017 | |
| CN | 106817093 A | | 6/2017 | |
| CN | 104521138 B | * | 7/2017 | ............ H03F 1/223 |
| CN | 109150115 A | | 1/2019 | |
| CN | 110098806 A | | 8/2019 | |
| CN | 113271069 A | | 8/2021 | |
| CN | 113328712 A | | 8/2021 | |
| CN | 114793094 B | * | 10/2022 | |
| WO | 2017008750 A1 | | 1/2017 | |
| WO | WO-2017027346 A1 | * | 2/2017 | ............ H03F 1/0222 |

OTHER PUBLICATIONS

Sato et al. "28-GHz Linear Power Amplifier", 2017 International Conference on Electron Devices and Solid-State Circuits (EDSSC) (Year: 2017).*

Wang et al. "A 900MHz high efficiency and linearity adaptive CMOS power amplifier", 2011 International Conference on Electric Information and Control Engineering (Year: 2011).*

* cited by examiner

BIAS CIRCUIT FOR RADIO FREQUENCY POWER AMPLIFIER

CROSS-REFERENCE TO RELATED APPLICATIONS

This application claims priority to Chinese Patent Application No. 202210530938.9, filed on May 16, 2022, the contents of which are hereby incorporated by reference.

TECHNICAL FIELD

The application belongs to the field of radio frequency integrated circuits, and particularly relates to a bias circuit for a radio frequency power amplifier.

BACKGROUND

With the development of silicon-based semiconductor technology, the silicon on insulator-complementary metal oxide semiconductor (SOI CMOS) technology realizes high-performance and high-density radio frequency (RF) integrated circuits with its advantages of low parasitic effect and high integration. However, due to the inherent low breakdown voltage of CMOS process, SOI RF power amplifier usually uses stacked transistors to increase output power.

Modern wireless communication systems require higher data transmission rate. At present, the high-order modulation method is widely used, and the high-order modulation signal has a high peak-to-average ratio, which leads to the fact that the power amplifier does not need the maximum output power most of the time. Therefore, it is necessary to lower the bias current of the power amplifier at low output power, so that the efficiency at low output power is improved without deteriorating the linearity at high output power, and then the bias voltage of stacked transistors is required to be adjusted adaptively. However, the existing amplifier bias circuit is failed to meet the requirement for adjusting the bias voltage of stacked transistors adaptively.

At present, the common amplifier adopts a resistor voltage divider bias circuit, and the bias voltages of the transistor is adjusted by adjusting the resistance of the resistor, so there is no feedback adjusting loop, and each bias voltage of the stacked transistor is failed to be dynamically adjusted with the change of the input signal power, resulting in poor linearity in the high efficiency region, low efficiency in the high linearity region, and it is difficult to achieve both high efficiency and high linearity.

SUMMARY

Based on this, the present application provides a bias circuit for a radio frequency power amplifier to overcome the defects of the prior art.

The bias circuit for a radio frequency power amplifier provided by the application includes a resistor voltage divider network, a power amplifier and a bias voltage adjusting loop.

The resistor voltage divider network is coupled with the power amplifier.

The bias voltage adjusting loop receives an input signal, and an output of the bias voltage adjusting loop is coupled to the resistor voltage divider network.

A power change of the input signal causes a change of an output current of the bias voltage adjusting loop, and the change of the output current causes changes of voltage drops of resistors in the resistor voltage divider network, so that bias voltages of transistors in the power amplifier changes positively linearly with a change of the input signal.

Optionally, the bias voltage adjusting loop includes one voltage divider resistor and one transistor pair, where the transistor pair includes a first metal oxide semiconductor (MOS) transistor and a second MOS transistor.

One terminal of the voltage divider resistor is connected with a reference voltage, and an other terminal is coupled with a gate of the first MOS transistor.

The gate of the first MOS transistor receives the input signal, a drain is short-circuited to the gate, and a source is grounded.

A gate of the second MOS transistor is coupled to the gate of the first MOS transistor, a drain is coupled to the resistor voltage divider network, and a source is grounded.

Optionally, one capacitor and one resistor connected in series are coupled between the gate of the first MOS transistor and the input signal.

Optionally, a choke inductor is coupled between the drain of the second MOS transistor and the resistor voltage divider network.

Optionally, the bias voltage adjusting loop includes one voltage divider resistor, one diode and one MOS transistor.

One terminal of the voltage divide resistor is connected with a reference voltage, and the other terminal is coupled with an anode of the diode.

The anode of the diode receives the input signal, and a cathode is grounded.

The gate of the MOS transistor is coupled with the anode of the diode, the drain is coupled to the resistor voltage divider network, and the source is grounded.

Optionally, one capacitor and one resistor connected in series are coupled between the anode of the diode and the input signal.

Optionally, one choke inductor is coupled between the drain of the MOS transistor and the resistor voltage divider network.

As can be seen from above technical schemes, the application has following beneficial effects.

The bias circuit for a radio frequency power amplifier provided by the application introduces the bias voltage adjusting loop, lowers the bias current of the power amplifier at low output power and raises the bias current of the power amplifier at high output power, and improves the efficiency at low output power without deteriorating the linearity at high output power, thereby achieving the purpose of improving the average efficiency of the power amplifier.

BRIEF DESCRIPTION OF THE DRAWINGS

In order to clearly explain the embodiment of the present application or the technical scheme in the prior art, the drawings needed in the description of the embodiment or the prior art will be briefly introduced below. Obviously, the drawings in the following description are only the embodiment of the present application, and other drawings may be obtained according to the provided drawings without creative labor for ordinary people in the field.

DETAILED DESCRIPTION OF THE EMBODIMENTS

In the following, the technical scheme in the embodiment of the application will be clearly and completely described with reference to the attached drawings. Obviously, the described embodiment is only a part of the embodiment of the application, but not the whole embodiment. Based on the embodiments in the present application, all other embodiments obtained by ordinary technicians in the field without creative labor belong to the scope of protection of the present application.

Figure 1:
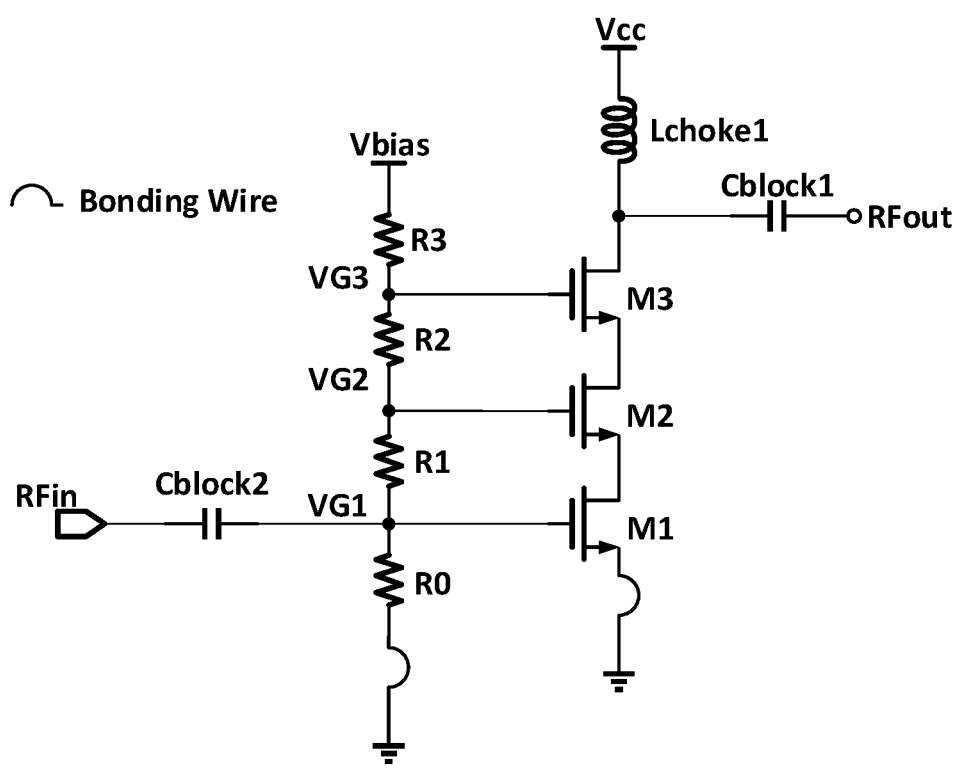
FIG. 1 is a bias circuit diagram of a prior art radio frequency (RF) power amplifier.

It is often difficult to balance the efficiency and linearity of a radio frequency power amplifier. Because of the inherent low breakdown voltage of complementary metal oxide semiconductor (CMOS) process, a silicon on insulator-radio frequency (SOI RF) power amplifier usually uses stacked transistors to realize high output power. At present, a resistor voltage divider bias circuit is commonly used to provide bias voltage for transistors in the amplifier. As shown in FIG. 1, taking a three-stage stacked transistors as an example, metal oxide semiconductor (MOS) transistors M1, M2 and M3 in the amplifier form a single-stage amplifier through a stacking mode, resistors R0-R4 form a resistor voltage divider network through series connection, and gates of the MOS transistors M1-M3 are coupled to one terminal of the resistors in the resistor voltage divider network. The drain voltage of the uppermost MOS transistor M3 is output as a signal amplification output through a capacitor Cblock1, the source of the lowermost MOS transistor M1 is grounded, and a signal RFin (radio frequency input) is coupled to a coupling point of a resistor R1 and the MOS transistor M1 through a direct current blocking capacitor Cblock2. Accurate bias voltages VG1-VG3 are obtained by reasonably selecting sizes of MOS transistors and adjusting resistance values of resistors R0-R4.

When the amplifier works in a large signal state, it provides a large output power, but there is obvious nonlinear distortion, because the nonlinear characteristics of transistors makes the linearity of the amplifier worse.

Therefore, in order to balance both linearity and efficiency of the amplifier as much as possible, in the following embodiments, the present application provides a bias circuit for a radio frequency power amplifier.

Figure 2:
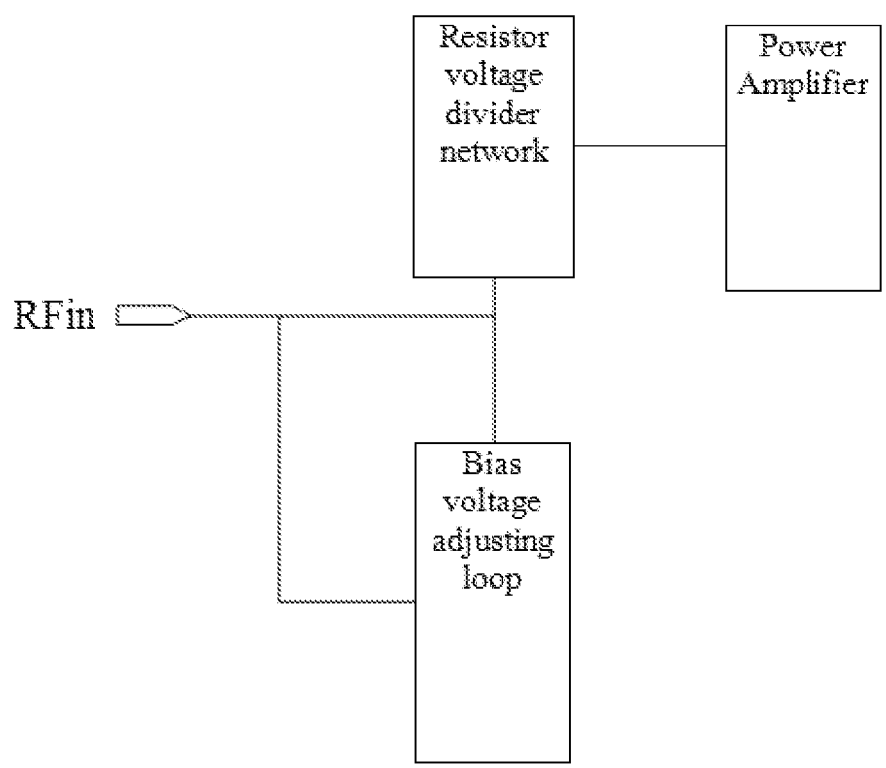
FIG. 2 is a schematic diagram of a bias circuit for a radio frequency power amplifier provided by an embodiment of the present application.

As shown in FIG. 2, the bias circuit for a radio frequency power amplifier includes resistor voltage divider network, a power amplifier and a bias voltage adjusting loop.

The resistor voltage divider network is coupled with the power amplifier.

The bias voltage adjusting loop receives an input signal, and the output of the bias voltage adjusting loop is coupled to the resistor voltage divider network.

A power change of the input signal causes a change of an output current of the bias voltage adjusting loop, and the change of the output current causes changes of voltage drops of resistors in the resistor voltage divider network, so that bias voltages of transistors in the power amplifier changes positively linearly with a change of the input signal.

The bias circuit for a radio frequency power amplifier provided by an embodiment lowers a bias current of the power amplifier at low output power and raises a bias current of the power amplifier at high output power, and improves the efficiency at low output power without deteriorating the linearity at high output power, thereby achieving the purpose of improving the average efficiency of the power amplifier. Moreover, the bias current is raised at high output power, and at the same time, the gate bias voltage of each stacked MOS transistor of the SOI power amplifier is dynamically adjusted according to the input signal, so that the linearity of the power amplifier at high output power is further guaranteed.

A specific embodiment is provided, in which a bias circuit of the three-stage stacked transistors shown in FIG. 1 is taken as an example.

Figure 3:
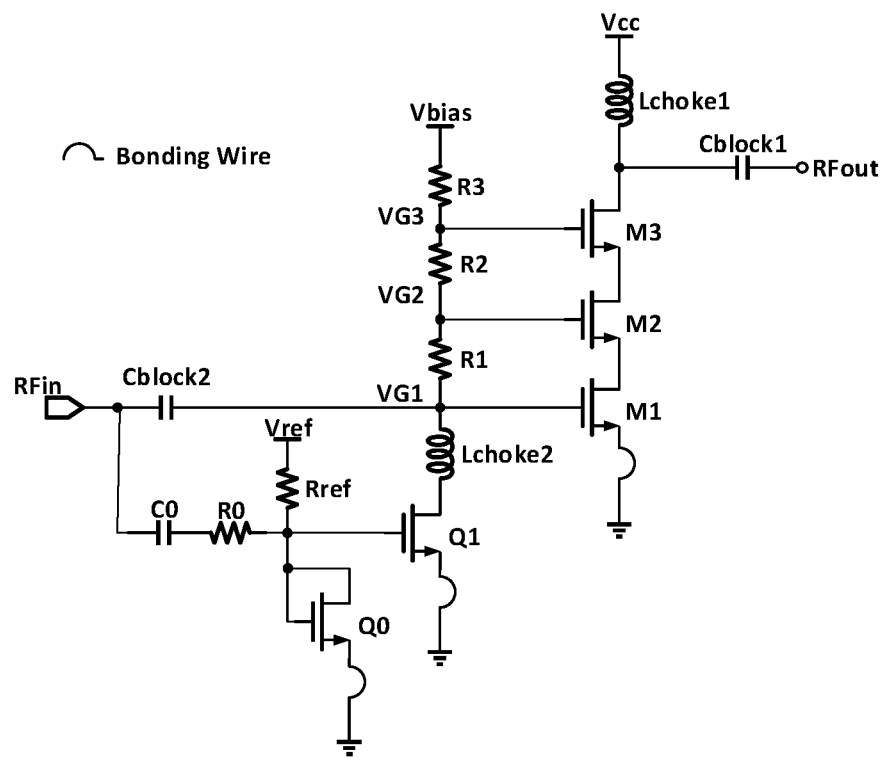
FIG. 3 is a schematic diagram of a bias circuit for a radio frequency power amplifier provided by an embodiment of the present application.

As shown in FIG. 3, the bias voltage adjusting loop includes one voltage divider resistor Rref and one transistor pair, where the transistor pair includes a first metal oxide semiconductor (MOS) transistor Q0 and a second MOS transistor Q1.

One terminal of the voltage divider resistor Rref is connected with a reference voltage Vref, and another terminal is coupled with the gate of the first MOS transistor Q0.

The gate of the first MOS transistor Q0 receives the input signal RFin, the drain is short-circuited to the gate, and the source is grounded.

The gate of the second MOS transistor Q1 is coupled to the gate of the first MOS transistor Q0, the drain is coupled to the resistor voltage divider network, and the source is grounded.

Optionally, a capacitor C0 and a resistor R0 connected in series are also coupled between the gate of the first MOS transistor Q0 and the input signal, and the drain of the second MOS transistor Q1 is coupled to the resistor voltage divider network through a choke inductor Lchoke2.

The resistor voltage divider network, the choke inductor Lchoke2 and second MOS transistor Q1 provide gate bias voltage for MOS transistors M1-M3 of the amplifier. The resistor Rref and first MOS transistor Q0 provide gate voltage for second MOS transistor Q1, and dynamically adjust the amplifier bias current and gate bias voltage of each stacked MOS transistor of the amplifier with the second MOS transistor Q1 and resistor voltage divider network.

The working principle of this circuit is as follows: because of the short-circuit of the drain of first MOS transistor Q0 to the gate, namely, connection in a form of diode, with an increase of input signal power, a direct current flowing into the first MOS transistor Q0 is increased, and a voltage drop at two terminals of the resistor Rref is increased, which leads to a decrease of gate and source voltages of second MOS transistor Q1, and further leads to a decrease of direct current flowing through second MOS transistor Q1. The decrease of current of the second MOS transistor Q1 causes a voltage drop at two terminals of the resistor R3 to decrease, which leads to an increase of the gate voltage VG3 of the MOS transistor M3. Similarly, a voltage drop at two terminals of the resistor R2 and the resistor R1 is also decreased, resulting in an increase of the gate voltage VG2 of the MOS transistor M2 and the gate voltage VG1 of the MOS transistor M1, so that the gate voltages of the MOS transistors M1-M3 are adaptively and dynamically adjusted according to the power change of the input signal.

Figure 4:
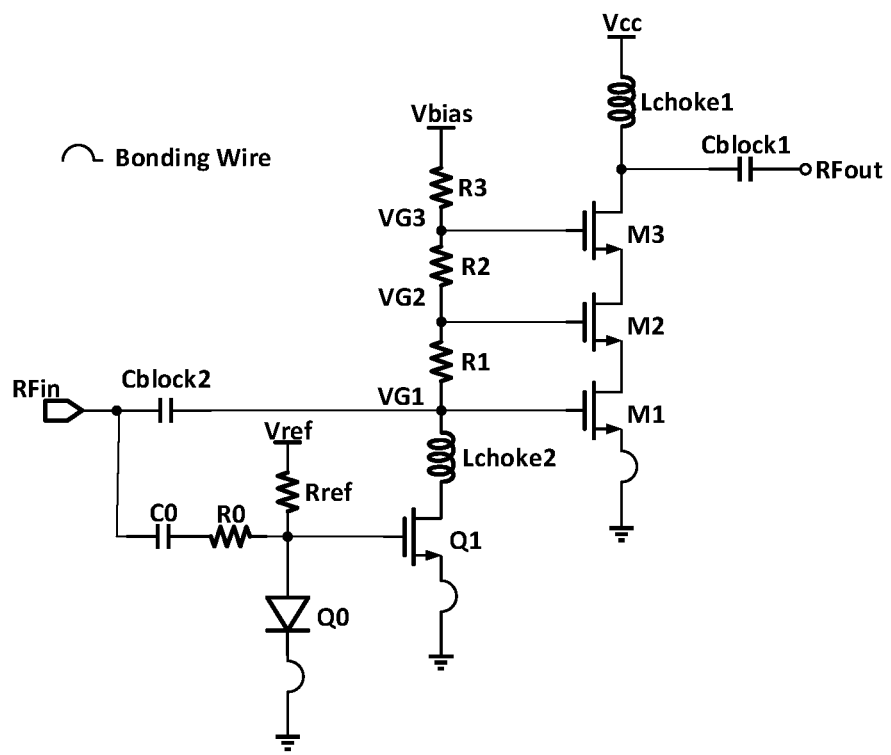
FIG. 4 is a schematic diagram of another bias circuit for a radio frequency power amplifier provided by an embodiment of the present application.

As shown in FIG. 4, another embodiment of the present application provides another bias circuit. On the basis of the previous embodiment, the first MOS transistor Q0 is replaced by a diode, and the specific working principle may be obtained in the same way, so the details are not repeated here.

Figure 5:
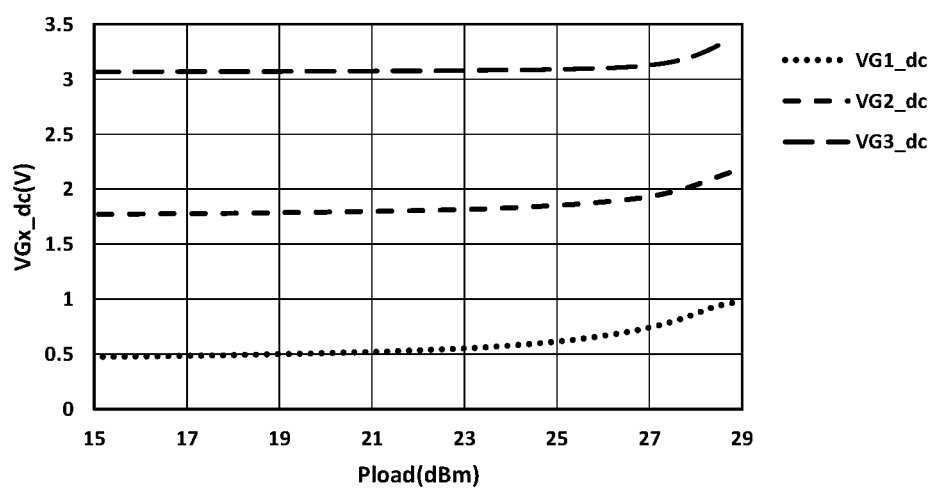
FIG. 5 is a waveform diagram of bias voltage of metal oxide semiconductor (MOS) transistors provided by an embodiment of the present application.

The bias circuit shown in FIG. 3 is taken as a test object, changes of gate bias voltages VG1-VG3 with the change of output signal power are recorded. As shown in FIG. 5, with an increase of output power Pload, the gate direct current bias voltages of MOS transistors M1, M2 and M3 are increased through the adjustment of the bias circuit.

It is easy to understand that although the embodiments of the present application adopt a three-stage stacked transistors, a person skilled in the art may increase or decrease the number of MOS transistors in the amplifier according to actual needs, and the number of stacked transistors is not limited by the technical scheme of the present application.

In the description of this application, it should be noted that the azimuth or positional relationship indicated by the terms "center", "upper", "lower", "left", "right", "vertical", "horizontal", "inner" and "outer" are based on the azimuth or positional relationship shown in the attached drawings, and are only for the convenience of describing this application and simplifying the description, and are not indicative or implied. In addition, the terms "first", "second" and "third" are only used for descriptive purposes and cannot be understood as indicating or implying relative importance.

The above embodiments are only used to illustrate the technical scheme of the present application, but not to limit it; although the present application has been described in detail with reference to the above-mentioned embodiments, it should be understood by those skilled in the art that the technical scheme described in the above-mentioned embodiments may still be modified or some technical features thereof can be replaced by equivalents. However, these modifications or substitutions do not make the essence of the corresponding technical scheme deviate from the spirit and scope of the technical scheme of the embodiment of the present application.

What is claimed is:

1. A bias circuit for a radio frequency power amplifier, comprising a resistor voltage divider network, a power amplifier and a bias voltage adjusting loop, wherein the resistor voltage divider network is coupled with the power amplifier;

the bias voltage adjusting loop receives a signal input, and an output terminal thereof is coupled to the resistor voltage divider network;

the bias voltage adjusting loop comprises one voltage divider resistor and one transistor pair, wherein the transistor pair comprises a first MOS transistor and a second MOS transistor;

one terminal of the voltage divider resistor is connected with a reference voltage, and an other terminal is coupled with a gate of the first MOS transistor;

the gate of the first MOS transistor receives the signal input, a drain is short-circuited to the gate, and a source is grounded;

a gate of the second MOS transistor is coupled to the gate of the first MOS transistor, a drain is coupled to the resistor voltage divider network, and a source is grounded;

because of short-circuit of the drain of the first MOS transistor to the gate, namely, connection in a form of diode, with an increase of a signal input power, a direct current flowing into the first MOS transistor is increased, and a voltage drop at two terminals of the voltage divider resistor is increased, and gate and source voltages of the second MOS transistor are caused to decrease, and a direct current flowing through the second MOS transistor is further caused to decrease; a decrease of the current of the second MOS transistor causes voltage drops at two terminals of resistors of the resistor voltage divider network to decrease, and gate voltages of the power amplifier are caused to increase, so that the gate voltages of the power amplifier are adaptively and dynamically adjusted according to a power change of an input signal.

2. The bias circuit for a radio frequency power amplifier according to claim 1, wherein one capacitor and one resistor connected in series are coupled between the gate of the first MOS transistor and the signal input.

3. The bias circuit for a radio frequency power amplifier according to claim 1, wherein one choke inductor is coupled between the drain of the second MOS transistor and the resistor voltage divider network.

* * * * *